United States Patent
Hageraats

(10) Patent No.: US 6,704,559 B1
(45) Date of Patent: Mar. 9, 2004

(54) BROADBAND RF MIXER WITH IMPROVED INTERMODULATION SUPPRESSION

(75) Inventor: Hans Hageraats, Saratoga, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 469 days.

(21) Appl. No.: 09/664,996

(22) Filed: Sep. 18, 2000

(51) Int. Cl.$^7$ .................. H04B 1/10; H04B 15/00; H04B 1/26

(52) U.S. Cl. ............ 455/326; 455/284; 455/285; 455/313; 455/323; 455/338; 455/295

(58) Field of Search ............... 455/313, 323, 455/333, 295, 296, 326, 317, 230, 255, 284, 285, 292, 293; 327/113, 110, 355, 359

(56) References Cited

U.S. PATENT DOCUMENTS

| | | | | |
|---|---|---|---|---|
| 5,015,968 A | | 5/1991 | Podell et al. ............... 330/277 |
| 5,589,791 A | * | 12/1996 | Gilbert .................. 327/359 |
| 5,859,559 A | * | 1/1999 | Hong et al. ............... 327/359 |
| 6,026,286 A | * | 2/2000 | Long ...................... 455/327 |
| 6,054,899 A | * | 4/2000 | Ke ......................... 330/278 |
| 6,140,849 A | * | 10/2000 | Trask ..................... 327/113 |
| 6,147,559 A | * | 11/2000 | Fong ...................... 330/292 |
| 6,204,728 B1 | | 3/2001 | Hageraats |
| 6,211,718 B1 | * | 4/2001 | Souetinov ................. 327/359 |

* cited by examiner

*Primary Examiner*—William Trost
*Assistant Examiner*—Meless Zewdu
(74) *Attorney, Agent, or Firm*—Blakely, Sokoloff, Taylor & Zafman LLP

(57) ABSTRACT

An RF mixer circuit having reduced intermodulation products includes a cascode transconductance amplifier including a first transistor having a control electrode connected to receive an input signal and serially connected with a second transistor having a control electrode connected to receive a bias potential. A balanced mixer is coupled to the second transistor by a first inductive element for receiving an amplified input signal current, and receiving a local oscillator signal and producing an output signal with an intermediate frequency related to the frequencies of the amplifier input signal and the local oscillator. A feedback circuit is provided from the second transistor to the control electrode of the first transistor including a resistor serially connected with a capacitor, whereby the feedback circuit compensates for signal phase shift by the inductive element.

24 Claims, 1 Drawing Sheet

BROADBAND RF MIXER WITH IMPROVED INTERMODULATION SUPPRESSION

BACKGROUND OF THE INVENTION

This invention relates generally to RF mixer circuits for broadband applications with improved intermodulation product suppression.

Broadband signal amplifiers are used in various wireless signal transmission applications requiring mixers for stepping up signals for transmission in assigned frequency channels and stepping down received signals to an intermediate (IF) frequency. Unfortunately, amplifiers distort signals by generating unwanted intermodulation products that can cause interference and cause poor performance.

Intermodulation distortion is defined in terms of the peak spurious level generated by two or more tones injected into a receiver. A receiver may be characterized by a third order distortion figure of merit referred to as "third order input intercept point" (IIP3), which is defined as the input power (in the form of two tones) required to create third order distortion products equal to the input two tone power. The linearity of an amplifier, and thus the immunity of the receiver to distortion and cross-talk, improves with the IIP3 of the amplifier.

Linearity and noise factor (NF) of the mixer are generally totally dominated by the transconductor stage which translates a voltage input to a current. The mixer is linearized by applying negative feedback to the transconductor, such as emitter degeneration or series feedback, which is a well-known technique. The emitter degeneration does not cancel the IM3 products, but merely surpresses them, at the expense of gain.

The present invention is directed to overcoming limitations of the prior art and providing a broadband mixer with improved intermodulation suppression.

SUMMARY OF THE INVENTION

In accordance with the invention, an RF mixer circuit having reduced intermodulation products includes a cascode transconductance amplifier including a first transistor having a control electrode connected to receive an input signal and serially connected with a second transistor having a control electrode connected to receive a bias potential. A balanced mixer is coupled to the second transistor by a first inductive element for receiving an amplified input signal, and receives a local oscillator input and produces an output signal with an intermediate frequency related to the frequencies of the amplifier input signal and the local oscillator. A second inductive element couples the second transistor to ground or a common terminal. To suppress intermodulation components, a feedback circuit is provided from the second transistor to the control electrode of the first transistor including a resistor serially connected with a capacitor, whereby the feedback circuit compensates for signal phase shift by the inductive element.

The feedback circuit components are selected as a function of input impedance of the mixer circuit, inductance of the inductive element, and the maximum frequency ($f_T$) of the cascode amplifier. The transistors can be bipolar or field effect transistors such as MOSFETS and CMOS transistors. The balanced mixer may be a single or double balanced design with a coupled coil output.

The invention and objects and features thereof will be more readily apparent from the following detailed description and dependent claims when taken with the drawing.

DETAILED DESCRIPTION OF ILLUSTRATIVE EMBODIMENTS

Figure 1:
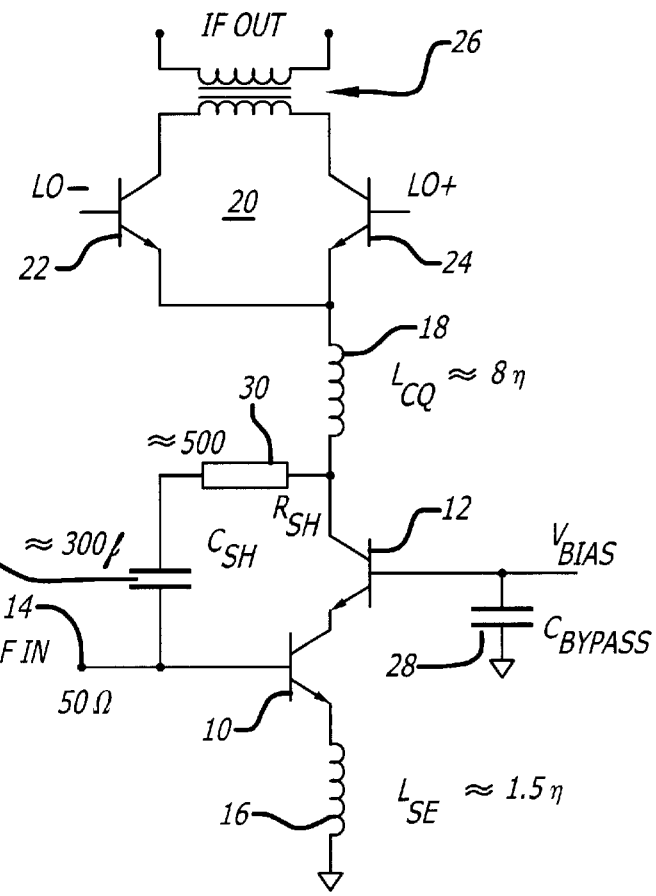
FIG. 1 is a schematic of an RF mixer circuit in accordance with one embodiment of the invention.

FIG. 1 is a schematic of an RF mixer circuit in accordance with one embodiment of the invention. In this embodiment a cascode amplifier comprising bipolar transistor 10 and bipolar transistor 12 function as a transconductance amplifier in converting an RF input signal at the input 14 to a corresponding current through transistor 10 which is amplified (impedance translated) by transistor 12. In this embodiment, the emitter of transistor 10 is connected through an inductor 16 to a circuit ground, and the collector of transistor 12 is connected through an inductive element 18 to the balanced mixer showing generally at 20 which includes transistor 22 and transistor 24 connected in parallel as push/pull switches in driving the output transformer 26. In phase and 180° out of phase signals from a local oscillator (LO) drive the two transistors 22, 24. A bias voltage $V_{bias}$ is applied to the base of transistor 12 to maintain a linear range of operation, and a bypass capacitor 28 couples the base of transistor 12 to ground.

In accordance with the invention, inductor 18 couples the transconductance stage to the mixer stage and introduces an inductance, but without significant resistance in the circuit which improves the amplification of the circuit. The reactance of inductor 18 is offset by a series resistor 30 and capacitor 32 feedback loop coupling the collector of transistor 12 to the gate of transistor 10. Inductor 18 along with inductor 16, resistor 30 and capacitor 32 are chosen to present a 50 ohm impedance at the gate of transistor 10.

The values of the components are readily derived and depend on the desired input impedance of the mixer core, the value of the series inductor, and the transit frequency ($f_T$) of the transistors. In one embodiment, with a 2 GHz input frequency, inductor 16 is on the order of 1.5 nH, inductor 18 is on the order of 8 nH, resistor 30 is on the order of 500 ohms, and capacitor 32 is on the order of 300 fF. For a 1 GHz input signal, inductor 18 is increased to 16 nH, resistor 30 is increased to 1000 ohms, and capacitor 32 is increased to 600 fF. In general, the higher input impedance of the mixer core, the lower the feedback capacitor value. Similarly, the higher the imaginary impedance of inductor 18, the higher the feedback resistor value to obtain the optimum phase shift.

The method is based on the fact that the collector-base capacitance Cjc (or Miller capacitance) of a bipolar transistor is able to cancel out the IM3 products that are generated by the non-linear base-emitter capacitance Cje. This can be shown by a comprehensive mathematical analysis of the various distortion products that are generated by a bipolar transistor. Unfortunately, due to the fact that Cjc is non-linear as well and dependent on the AC output voltage, the IIP3 net improvement is insignificant. However, if one were able to make Cjc linear (not zero), the IM3 products can be totally eliminated. This is done by creating a cascode stage by adding an extra transistor 12 (FIG. 1) so that a relatively small output impedance to the CE stage 10 is applied (which minimizes the AC output voltage) and by adding a linear feedback capacitor 32 to the amplifier. This removes the non-linear Cjc out of the distortion equation and replaces it with a constant term, which greatly improves the IIP3 specification without lowering the gain and increasing the NF. Note that the mixer 20 input impedance is only 1/gm and thus will not present an adequate load for the shunt amplifier. Preferably, the loading impedance is resistive for IM3 cancellation, but the replacement of inductor 18 by a resistor would lower the available headroom, increase the NF and lower the power gain. To compensate for the 90 degree phase shift due to inductor 18, resistor 30 is added.

A mathematical analysis of the various distortion products generated by a bipolar transistor shows that the collector-base capacitance Cjc (or Miller capacitance) of the bipolar transistor is able to cancel the various IM3 products that are generated by the non-linear base-emitter capacitance Cje. Unfortunately, due to the fact that Cjc is non-linear as well and dependent on the AC output voltage, the net improvement is insignificant. However, if one were able to make Cjc linear and non-zero, the IM3 products can be totally eliminated. The invention accomplishes this by (1) creating a cascode stage by adding CB stage 12 to CE emitter stage 10 (FIG. 1). This applies a relatively small output impedance to stage 10, so that the AC output voltage is minimized. In the next step (2), the linear feedback capacitor 32 is added to the amplifier circuit. As a result, the non-linear Miller capacitance Cjc is taken out of the distortion equation and is replaced with a constant term. This greatly improves the IIP3 products. Ideally, the amplifier drives a resistive load, which is mandatory for the cancellation of the IM3 products. As is well known, a mixer stage consisting of CB stages exhibits an input impedance of only 1/gm, which is too low to achieve any power gain. The overcome this problem, inductor 18 is added, which improves the power gain considerably, but which unfortunately also alters the phase of the signal at the collector of 12. To compensate for this undesired phase shift, resistor 30 should be added to still achieve cancellation of the IM3 products.

Circuitry in accordance with the invention provides significant performance improvement over the prior art. For example, the circuit in FIG. 1 exhibits an IIP3 of +10 dbm and a NF of 5.8 dB at 2.0 GHz, while consuming only 5 mA. It was fabricated on a bipolar only process with a transit frequency ($f_T$) of 30 GHz.

Figure 2:
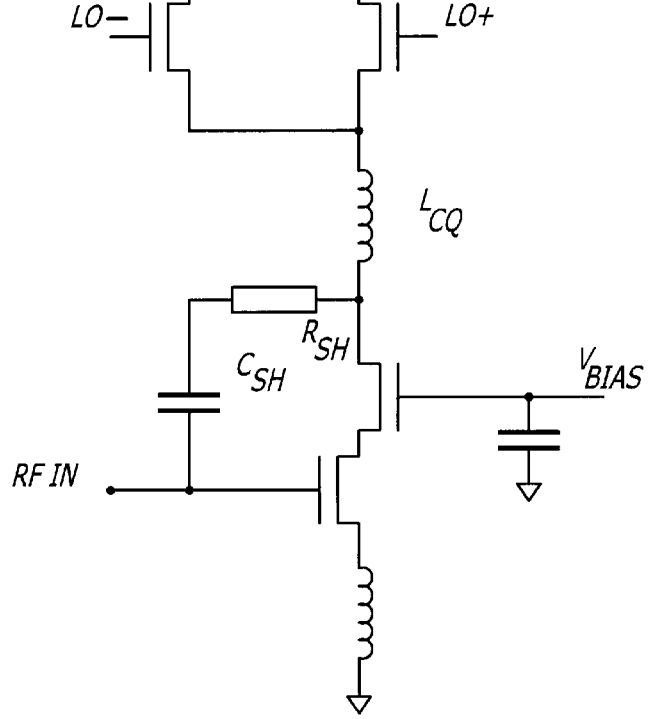
FIG. 2 is a schematic of another embodiment of the invention, like elements in FIGS. 1 and 2 having the same reference numerals.

While the embodiment of FIG. 1 is implemented using bipolar transistors, a mixer in accordance with the invention can be implemented with field effect transistors and MOSFET transistors, as illustrated in FIG. 2. Like elements in FIG. 2 have the same reference numerals as elements in FIG. 1.

The use of inductive coupling and an RC circuit feedback in accordance with the invention provides enhanced intermodulation suppression in the mixer circuit. While the invention has been described with reference to specific embodiments, the description is illustrative of the invention and is not to be considered as limiting the invention. Various modifications and applications may occur to those skilled in the art without departing from the true spirit and scope of the invention as defined by the appended claims.

What is claimed is:

1. An RF mixer circuit having reduced intermodulation products comprising:
    a) a cascode transconductance amplifier with inductive emitter degeneration including a first transistor having a control electrode connected to receive an input RF signal and serially connected with a second transistor having a control electrode connected to receive a bias potential;
    b) a balanced mixer coupled to the second transistor by a first inductive element for receiving an amplified input signal and receiving a signal from a local oscillator and producing an output signal with an intermediate frequency related to the frequencies of the amplifier input signal and the local oscillator, and
    c) a feedback circuit from the second transistor to the control electrode of the first transistor including a resistor serially connected with a capacitor, whereby the feedback circuit compensates for signal phase shift by the inductive element so that the IM3 products are cancelled out.

2. The RF mixer circuit as defined by claim 1 wherein the feedback circuit components are selected as a function of input impedance of the mixer circuit, inductance of the inductive element, and the maximum frequency ($f_T$) of the cascode amplifier.

3. The RF mixer circuit as defined by claim 1 and further including a capacitive element coupling the control electrode of the second transistor to a circuit ground potential.

4. The RF mixer circuit as defined by claim 3 and further including a second inductive element coupling the first transistor to the circuit ground potential.

5. The RF mixer circuit as defined by claim 4 wherein the first transistor and the second transistor are bipolar transistors.

6. The RF mixer circuit as defined by claim 5 wherein the input signal has a frequency on the order of 2 GHz, the feedback circuit has a resistor on the order of 500 ohms and a capacitor on the order of 300 fF, the first inductive element is on the order of 8 nH, and the second inductive element is on the order of 1.5 nH.

7. The RF mixer circuit as defined by claim 5 wherein the input signal has a frequency on the order of 1 GHz, the feedback circuit has resistor on the order of 1000 ohms and a capacitor on the order of 600 fF, the first inductive element is on the order of 16 nH, and the second inductive element is on the order of 3 nH.

8. The RF mixer circuit as defined by claim 4 wherein the first transistor and the second transistor are field effect transistors.

9. The RF mixer circuit as defined by claim 8 wherein the first transistor and second transistor are MOSFETs.

10. The RF mixer circuit as defined by claim 1 wherein the mixer comprises a pair of transistors in parallel driven by an in-phase and 180° out of phase local oscillator signals.

11. In an RF mixer circuit in which a cascode transconductance amplifier with inductive emitter degeneration receives an input signal and drives a mixer stage controlled by a local oscillator, circuitry for suppressing intermodulation components comprising an inductive element coupling the cascode transconductance amplifier to the mixer stage, and a cascode transconductance amplifier feedback loop comprising a resistor serially connected with a capacitor, the feedback loop compensating for phase shift imparted by the inductive element.

12. Circuitry as defined by claim 11 wherein the cascode transconductance amplifier includes a first transistor having a control electrode connected to receive an input signal and serially connected with a second transistor having a control electrode connected to receive a bias potential; the feedback loop coupling the output of the second transistor to the control electrode of the first transistor.

13. A method of RF mixing to provide reduced intermodulation products comprising:
    a) providing a cascode transconductance amplifier with inductive emitter degeneration including a first transistor having a control electrode connected to receive an input RF signal and serially connected with a second transistor having a control electrode connected to receive a bias potential;

b) providing a balanced mixer coupled to the second transistor by a first inductive element for receiving an amplified input signal and receiving a signal from a local oscillator and producing an output signal with an intermediate frequency related to the frequencies of the amplifier input signal and the local oscillator, and c) feeding back a signal from the second transistor to the control electrode of the first transistor through a feedback circuit including a resistor serially connected with a capacitor, whereby the feedback circuit compensates for signal phase shift by the inductive element so that the IM3 products are cancelled out.

14. The method as defined by claim 13 wherein the components of the feedback circuit are selected as a function of input impedance of the mixer circuit, inductance of the inductive element, and the maximum frequency ($f_T$) of the cascode amplifier.

15. The method as defined by claim 13 further including providing a capacitive element coupling the control electrode of the second transistor to a circuit ground potential.

16. The method of claim 15 and further including providing a second inductive element coupling the first transistor to the circuit ground potential.

17. The method of claim 16 wherein the first transistor and the second transistor are bipolar transistors.

18. The method of claim 17 wherein the input signal has a frequency on the order of 2 GHz, the feedback circuit has a resistor on the order of 500 ohms and a capacitor on the order of 300 fF, the first inductive element is on the order of 8 nH, and the second inductive element is on the order of 1.5 nH.

19. The method of claim 17 wherein the input signal has a frequency on the order of 1 GHz, the feedback circuit has resistor on the order of 1000 ohms and a capacitor on the order of 600 fF, the first inductive element is on the order of 16 nH, and the second inductive element is on the order of 3 nH.

20. The method of claim 16 wherein the first transistor and the second transistor are field effect transistors.

21. The method as defined by claim 20 wherein the first transistor and second transistor are MOSFETs.

22. The method as defined by claim 13 wherein the mixer comprises a pair of transistors in parallel driven by an in-phase and 180° phase local oscillator signals.

23. For use in an RF mixer in which a cascode transconductance amplifier with inductive emitter degeneration receives an input signal and drives a mixer stage controlled by a local oscillator, a method of suppressing intermodulation components comprising providing an inductive element coupling the cascode transconductance amplifier to the mixer stage, and providing a cascode transconductance amplifier feedback loop comprising a resistor serially connected with a capacitor, the feedback loop compensating for phase shift imparted by the inductive element.

24. The method of claim 23 wherein the cascode transconductance amplifier includes a first transistor having a control electrode connected to receive an input signal and serially connected with a second transistor having a control electrode connected to receive a bias potential;

the feedback loop coupling the output of the second transistor to the control electrode of the first transistor.

* * * * *